United States Patent [19]

Zbinden et al.

[11] Patent Number: 4,654,599

[45] Date of Patent: Mar. 31, 1987

[54] FOUR PHASE CLOCK SIGNAL GENERATOR

[75] Inventors: Terry B. Zbinden, Maple Grove; Richard D. Marthaler, Blaine, both of Minn.

[73] Assignee: Sperry Corporation, New York, N.Y.

[21] Appl. No.: 751,718

[22] Filed: Jul. 5, 1985

[51] Int. Cl.[4] .............................................. H03K 3/00
[52] U.S. Cl. ...................................... 328/62; 328/55; 377/43
[58] Field of Search ..................... 328/60, 62, 105, 55; 377/43, 64, 70

[56] References Cited

U.S. PATENT DOCUMENTS 3,740,660 6/1973 Davies, Jr. ............................. 328/62
4,386,323 5/1983 Jansen .................................... 328/55
4,443,765 4/1984 Findeisen et al. ..................... 328/55

Primary Examiner—John S. Heyman
Assistant Examiner—Karl Ohralik
Attorney, Agent, or Firm—Charles A. Johnson; Kenneth T. Grace; Marshall M. Truex

[57] ABSTRACT

A system for and a method of generating a four phase clock signal is disclosed. The system includes an oscillator circuit that generates a clocking signal of frequency F. A flip-flop, under control of a Master Clear signal, establishes the first stage of a shift register in an active state while the clocking signal drives the shaft register to serial, end-around, shift the active state through the shift register. The parallel outputs of the shift register are coupled to respectively associated pulse generators which are also triggered by the clock signal to emit the four phase clock signal therefrom. The method ensures that the first phase signal is always the first signal to be emitted from the system while compatible semiconductor circuitry is used throughout and is operated at or near the frequency limit of the semiconductor circuitry used.

3 Claims, 2 Drawing Figures

FOUR PHASE CLOCK SIGNAL GENERATOR

BACKGROUND OF THE INVENTION

1. Field of the Invention

The present invention relates to the field of electronic digital computer systems and in particular to a generator of a multiple phase clocking signal that is comprised of high frequency, uniformally spaced, uniformally shaped, pulses that are utilized for timing and synchronizing the operation of a computer system.

2. Description of the Prior Art

In a computer system that is comprised of synchronous electronic digital data processing equipment, it is known to use an oscillator circuit as the source of control and clock signals that time and synchronize the computer system's operation. It is also known to use shaping or pulse generating circuitry to shape the clock signal for the desired rise and fall time and amplitude. In addition to shaping the clock signal, it is also known to utilize phase generating circuitry to develop, from the clock signal, signals that represent a multiphase clock phase signal. For example, a clock signal of a frequency F may be utilized to generate, by phase generating circuitry, a multiphase clock signal of frequency F/N where the pulses of the clock phase signal have a predetermined interrelationship of time of occurrence.

In addition to the time relationship between the occurrence of the pulses of the clock phase signal, it is common for the pulses of the clock phase signal to be of similar signal shape with regard to rise time, fall time and amplitude. The clock phase signals are utilized through their known shape and time relationships to time sequences of computer system operation. If the clock phase signal generating circuitry fails to maintain the predetermined time relationship, a so-called clock skew results, and if this skew is too great, the computer system will generate error signals that stop computer system operation.

For clock signal timing of digital data processing equipment, clocking rate requirements are a function of the switching speed of the circuitry incorporated in the equipment. While early vacuum tube circuitry required clocking rate capability in the range of hundreds of kilohertz (KHz), discrete semiconductor circuits have required clocking rates that are orders of magnitude faster, while very large scale integrated (VLSI) circuitry have required clocking rates that are orders of magnitude greater than discrete semiconductor circuits. As clock rates increase, tolerances within the clock phase signal are necessarily diminished, and clock skew becomes an ever increasing problem.

Multiphase clock signal generating circuitry requires a driving clock signal that has symmetrical pulse shape and spacing, which clock signal is characteristically desired to have a 50 percent duty cycle. The precision of the duty cycle of the clock signal is especially critical in computer systems that utilize level sensitive circuitry. It is even more critical when both the positive and negative levels are utilized to control the logic circuitry. At relatively low frequencies of the clock source signal, a straightforward approach for providing the desired symmetrical clock signal is to drive a flip-flop circuit with the clock source signal in a manner such that there is an equivalent division by two for deriving the output clock signal frequency. It is of course apparent that the frequency of the clock source signal must be double that of the desired clock signal for such an approach to be feasible.

As clock signal frequencies increase, for example at 25 megahertz (MHz) and above, several design limitations arise in applying the flip-flop divider circuit. A major problem is that a flip-flop circuit will not exhibit the precisely same switching rates for driving an output terminal to achieve a rising edge as it will to drive the output terminal in the opposite direction to achieve a falling edge. At high clocking rates these differences in circuit switching rates result in an output clock signal waveform that does not exhibit the characteristic of a 50 percent duty cycle with an acceptable tolerance, and, accordingly, provides an unsatisfactory operation of the controlled circuitry. It has been found that by a careful selection of components, flip-flop dividers may work adequately, but would not be self-adjusting, would be relatively expensive, and would not yield an operation of a fixed pulse width, plus or minus 1 nanosecond (ns) which is nominally 50% duty cycle at normal operating frequency. A further drawback is that to obtain symmetrical clocking signals using this flip-flop technique it requires clock source signal frequencies double the desired output frequency. If the clock source signal circuitry is to be fabricated utilizing the same circuit technology as does the logic circuitry that is to be gated, the flip-flop divider approach is unworkable at higher frequencies.

Further, in many computer systems it is essential that upon power-on, or start-up, of the computer system or of its various components, or as by a Master Clear signal being coupled thereto, a multiphase clock signal always starts or begins with the first phase $\phi 1$ pulse without the generation of runt or distorted signals. The clock generating circuitry of the present invention ensures that the multiphase clock signal always starts with the first phase $\phi 1$ pulse while using the same semiconductor technology and requiring no adjustments of timing or of pulse shape. It is particularly adapted for high volume production of high speed, low to medium scale, computer systems, such as personal computers, while operating at a frequency that is near the speed limit of the logic family that is incorporated in the associated computer system.

SUMMARY OF THE INVENTION

The present invention is directed toward a system for and a method of generating a multiphase clock phase signal for the control of the operation of a computer system. The multiphase clock signal generating system includes an oscillator circuit that generates a clocking signal of frequency F which drives a shift register, under additional control of two flip-flops, of multiple N stages. Each of the stages provides at respectively associated output pulse generator gates, which are also gated, or enabled, by the clocking signal, a respectively associated one of the phases. The circuit configuration ensures that at power-on, or start-up, of the system, the clock phase signal always starts with the first phase $\phi 1$ pulse, without pulse distortion, while operating at a speed near the limit of the technology used throughout.

DESCRIPTION OF THE PREFERRED EMBODIMENT

Figure 1:
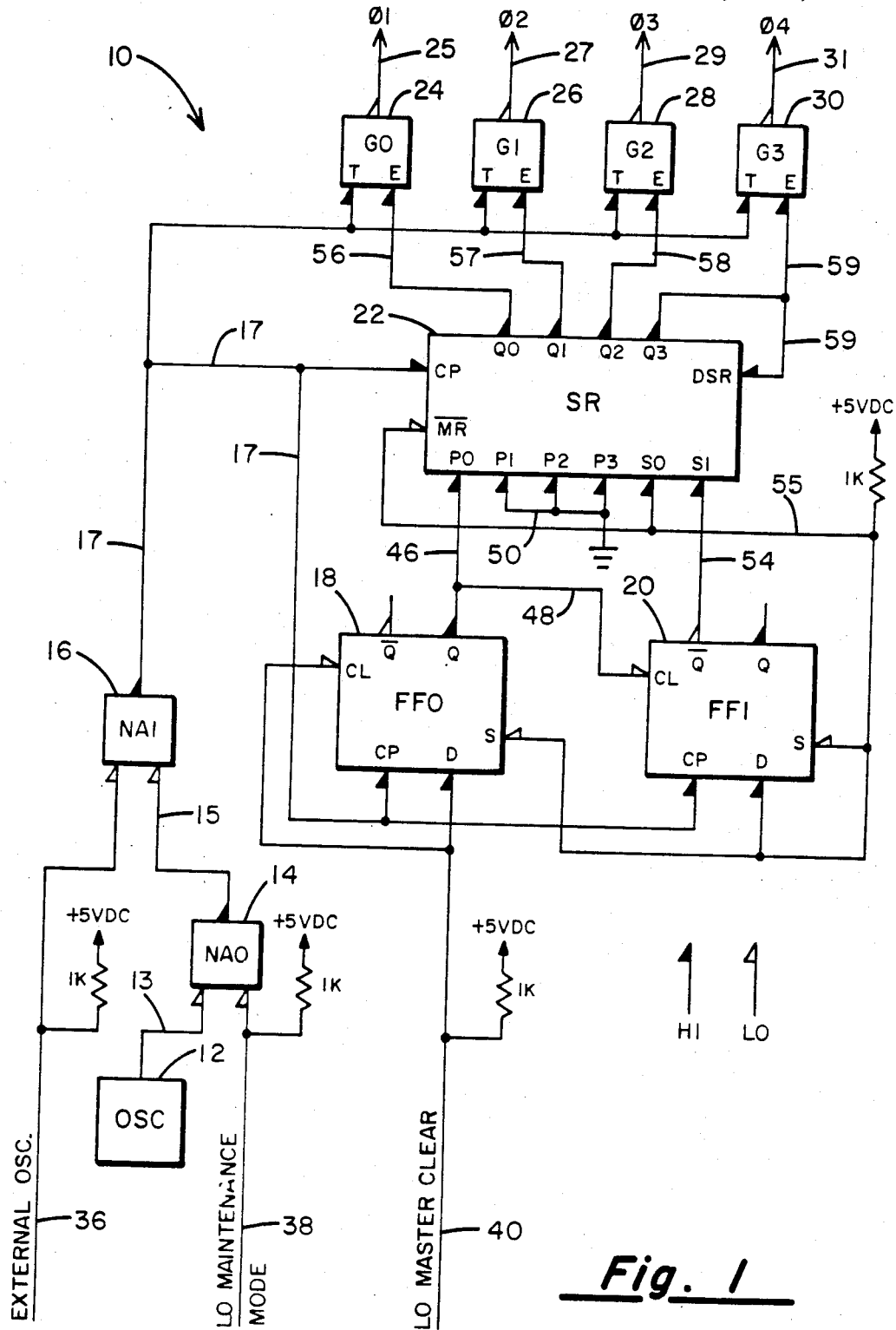
FIG. 1 is a block diagram of the clock phase signal generating system of the present invention.

Before going into a detailed description of the operation of the preferred embodiment of FIG. 1, a brief description of the semiconductor technology of the logic elements incorporated therein will be presented. The following consists of a listing of the part name and part number and the manufacturer's name and part number (P/N):

Oscillator 12—Motorola—P/N K1144AM
NAND Gates 14, 16—Fairchild—P/N 74F00
Flip Flops 18, 20—Fairchild—P/N 74F74
Shift Register 22—Fairchild—P/N 74F194
Pulse Generators 24, 26, 28, 30—Engineered Components Company—P/N STTLPGM-224

All components are compatible TTL semiconductor technology and operate at a frequency of 37 MHz as determined by oscillator 12. Data at the D inputs of FF 18, 20 is transferred to the outputs Q, $\bar{Q}$ only on the positive going edge of the clock signal 32 pulse at the CP input. Shift register 22 is a 4-bit bidirectional shift register with data inputs P0, P1, P2, P3 and data outputs Q0, Q1, Q2, Q3. Data transfer or shifting within shift register 22 occurs only on the positive going edge of clock signal 32 at the CP input. For the illustrated shift right operation, input S0 is held Hi, input S1 is held Lo, and for parallel load of the P0, P1, P2, P3 data inputs, both S0, S1 are held Hi. Pulse generators 24, 26, 28, 30 are enabled by Hi inputs from the Q outputs of shift register 22, but such Hi inputs produce the four phase clock signal Lo output pulses on lines 25, 27, 29, 31 only on the positive going edge of clock signal 32 from line 17 (and oscillator 12).

Figure 2:
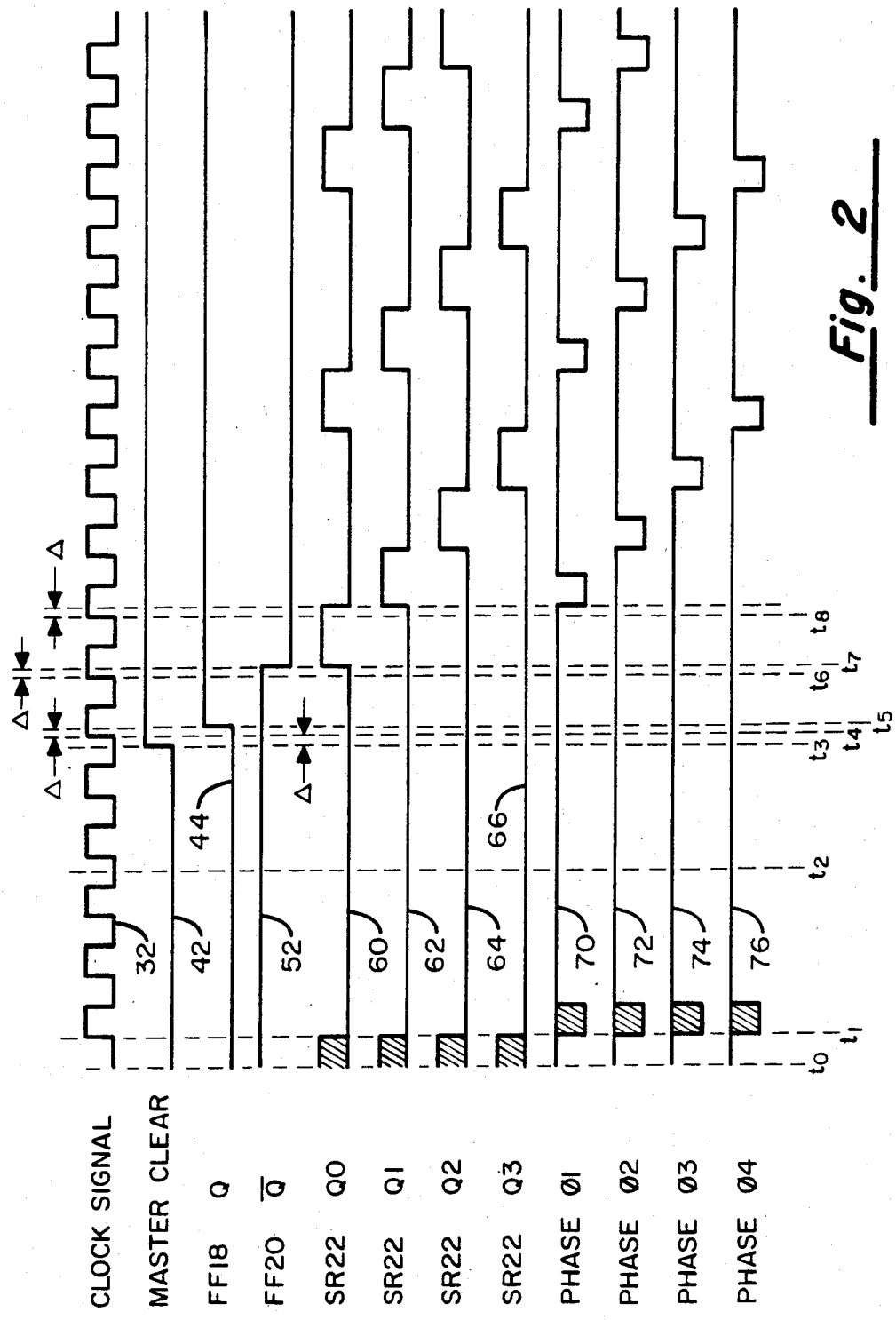
FIG. 2 is an illustration of a timing diagram associated with the operation of the system of FIG. 1.

Initially, as at a time t0 of FIG. 2:

Power (On) is coupled to the computer system in which the four phase clock signal generator 10 of FIG. 1 is incorporated;

Oscillator 12 is running and coupling the 37 MHz clock signal 32 of FIG. 2 to line 13;

External Oscillator signal is held Hi (or open) on line 36;

Maintenance Mode signal is held Hi on line 38;
Master Clear signal is held Lo on line 40.

At this time then, as at time t0:

Oscillator 12 is running and coupling clock signal 32 to NAND 14;

The output of NAND 14 on line 15 is the complement, or inverse, of clock signal 32;

The output of NAND 16 on line 17 is the same as clock signal 32;

The outputs Q, $\bar{Q}$ of FF 18 and 20 are in the Clear state because of the Lo Master Clear signal on line 40;

The outputs Q0, Q1, Q2, Q3 of shift register 22 are unknown.

The first positive going edge of clock signal 32 after time t0, as at time t1, at pulse generators 24, 26, 28, 30, via line 17, will enable the unknown outputs Q0, Q1, Q2, Q3 of shift register 22 to be coupled to the respectively associated output lines 25, 27, 29, 31, respectively, as the four phases $\phi1$, $\phi2$, $\phi3$, $\phi4$ of the four phase clock signal output of multiphase clock signal generator 10. This enabling of the unknown states of the outputs Q0, Q1, Q2, Q3 of shift register 22 to be coupled to the four phase signal output lines 25, 27, 29, 31 after the occurrence of the first positive going edge of clock signal 32 after Power On will be the only time that random four phase clock signals will be output from four phase clock signal generator 10.

With the Master Clear signal, represented by timing signal 42 of FIG. 2, on line 40 being held Lo, FF 18 will be forced into a Clear condition whereby the Q output, represented by timing signal 44, is held Lo, holding, via line 46, the P0 input of shift register 22 Lo while the Q output, via line 48, forces FF 20 into a Clear condition. This causes its $\bar{Q}$ output, represented by timing signal 52, on line 54 to be held Hi coupling a Hi signal to input S1 of shift register 22. At this time then, both inputs S0 and S1 of shift register 22 are held Hi whereby shift register 22 will now accept parallel data on its inputs P0, P1, P2, P3, which inputs are now being held Lo via line 46 and line 50, which is coupled to a ground voltage source.

The first positive going edge of clock signal 32 after power on and before Master Clear signal 42 goes Hi, as at time t2, clocks this parallel data, all Lo's representative of no data, into the respectively associated stages of shift register 22. As all stages of shift register 22 contain no data, outputs Q0, Q1, Q2, Q3 being all Lo signals, will disable all pulse generators 24, 26, 28, 30, which pulse generators are enabled only by Hi signals on the respective data out lines 56, 57, 58, 59. After this time then, as at time t2, no change in the states of the stages of shift register 22 or of FF 18 or 20 will occur until the Master Clear signal 42 on line 40 goes Hi.

Now, assume that Master Clear signal 42 on line 40 switches to and is held in its Hi state, as at time t3, which Hi state is clocked into FF 18, via line 17 upon the next positive going edge of clock signal 32, as at time t4. At this same time, at time t4, clock signal 32, at shift register 22 input CP, will also go Hi; however, all data inputs P0, P1, P2, P3 are held Lo and operating mode inputs S0, S1 are still held Hi. The delay Δ of FF 18 delays the change of state of FF 18 output Q, until time t5 and prevents this positive going edge of clock signal 32 from loading any new data into shift register 22.

On the next positive going edge of clock signal 32, as at time t6, the new data, which is a Hi input to P0 and Lo inputs to P1, P2, P3, is clocked into shift register 22. After this same positive going edge of clock signal 32, as at time t7, new Hi data is clocked into FF20, the $\bar{Q}$ output of which goes Lo, after the propagation delay of FF20, and, via line 54, the operating mode input S1 goes Lo setting shift register 22 into a right serial shift mode. Shift register 22 is parallel loaded before the Q output of FF20 goes Lo. With an active, or Hi, signal, represented by timing signal 60, now stored in stage 1 of shift register 22, phase $\phi1$ of the four phase clock signal is enabled; however, because pulse generators 24, 26, 28, 30 are positive edge triggered, no four phase pulse signals have yet been generated. The first pulse, phase $\phi1$, represented by timing signal 70, will be generated on the next positive going edge of clock signal 32, as at time t7. From this time on, the single active signal established in stage 1 of shift register 22 will be shifted through shift register 22, as represented by timing signals 60, 62, 64, 66, at the frequency of clock signal 32 to be reset into the first stage of shift register 22 via output Q3, line 59 and input DSR. This operation is as indicated by FIG. 2.

If subsequently the Master Clear signal on line 40 is again forced Lo, the output from the four phase clock signal generator 10 will stop on the next phase or the following phase $\phi1$, $\phi2$, $\phi3$, or $\phi4$ dependent upon the timing of the Master Clear signal. Signal generator 10 will not necessarily stop only after output of phase ∅4; however, because a Master Clear signal has been initiated, such random stopping of the four phase clock signal from four phase clock signal generator 10 is not a problem. The start-up after the coupling of a Hi Master Clear signal to line 40 will be as described above.

Four phase clock signal generator 10 includes provisions for operation in a Maintenance Mode with an external oscillator of any frequency from 0 to 37 Megahertz. A change from normal operation utilizing oscillator 12 to Maintenance Mode operation utilizing an external oscillator must be performed under precise conditions. Under this condition, Maintenance Mode signal on line 38 must be switched to be held Lo prior to the coupling of a Hi Master Clear signal to line 40 and several four phase clock signal pulses ∅1, ∅2, ∅3, ∅4 must be generated before the Master Clear signal is switched Hi to set up shift register 22 for the correct initial states. This Maintenance Mode condition would require one Hi to Lo transition of the external oscillator signal on line 36 while the Master Clear signal on line 40 would be switched Hi prior to the next negative going edge of the external oscillator signal on line 36. The first phase signal ∅1, will be coupled to line 25 on the next negative going transition of the external oscillator signal on line 36. Successive phases, ∅2, ∅3, ∅4, ∅1, ∅2, ∅3, ∅4, ∅1, etc., as represented by timing signals 70, 72, 74, 76, will follow in sequence.

In consideration of the above specification and drawings, it is apparent that applicants have disclosed novel circuitry for generating a four phase clock signal using similar semiconductor technology throughout. Further, such circuitry needs no adjustment, maintains a fixed pulse width plus or minus 1 nanosecond, which is nominally 50% duty cycle at normal operating frequency, and is relatively inexpensive permitting its use in the production of high-speed, low-to-medium scale computer systems.

What is claimed is:

1. An N Phase Clock signal generator, comprising:
   oscillator means for generating a clock signal of a frequency F;
   shift register means having N stages and having respective ones of N inputs and N outputs coupled to associated ones of said N stages, where N is an integer greater than 1;
   N two-input pulse generators, each having first inputs that are parallelly coupled to said clock signal, and second inputs, each separate one coupled to a respectively associated separate one of said N outputs of said shift register means;
   first bistable means having complementary $\overline{Q}$ and Q outputs, a Clear input, a Clock input, and a Data input;
   Master Clear signal source means for coupling an initial Clear signal to the Clear input and the Data input of said first bistable means and a subsequent Set signal to the clear input and the Data input of said first bistable means;
   means coupling said clock signal to the Clock input of said first bistable means for establishing said first bistable means in alternative Clear or Set states as determined by said Master Clear signal;
   means coupling the Q output of said first bistable means to the first one of the N inputs of said shift register means for establishing the first stage of said shift register means in a Set state;
   means coupling a first voltage source to all but the first one of the N inputs of said shift register means for establishing all but the first one of said N input stages of said shift register means in a Clear state;
   said Clock signal and the Set state of the first one of the N stages of said shift register means generating serialized Set output signals at said N outputs for enabling said N pulse generators to output the N phases of said N Phase Clock signal at said frequency F.

2. The N phase clock signal generator of claim 1 further including:
   second bistable means having complementary $\overline{Q}$ and Q outputs, a Clear input, a Clock input, and a Data input;
   means coupling the Q output of said first bistable means to the Clear input of said second bistable means;
   means coupling the $\overline{Q}$ output of said second bistable means to an operating mode input of said shift register means for enabling the signals coupled to the N inputs of said shift register means to be coupled to the respectively associated stages.

3. An N phase clock signal generator, comprising:
   oscillator means for generating a clock signal of a series of pulses of 50% duty cycle and of a frequency N;
   shift register means having N stages and having respective ones of N inputs and N outputs coupled to associated ones of said N stages, where N is an integer greater than 1;
   N two-input pulse generator means, each having first inputs that are coupled in parallel to said clock signal and second inputs, each separate one coupled to a respectively associated one of said shift register means M outputs;
   first and second bistable means, each having $\overline{Q}$ and Q outputs, a Clear input, a Clock signal input, and a Data input;
   means coupling said clock signal to said shift register means and to said first and second bistable means;
   Master Clear signal source means coupled to the Data input and the Clear input of said first bistable means for establishing said first bistable means in a Clear state when said Master Clear signal is held Lo or in a Set state when said Master Clear signal is held Hi and a clock signal pulse is on the positive edge;
   means coupling a second voltage source to an operating mode S0 input of said shift register means for establishing said S0 input in a Set state;
   means coupling a first Lo voltage source to all but the first one of the N inputs of said shift register means;
   means coupling a second Hi voltage source to the first operating mode S0 input to said shift register means;
   means coupling a second Hi voltage source to the first operating mode S0 input to said shift register means;
   means coupling the Q output of said first bistable means to the first one of the N inputs of said shift register means and to the Clear input of said second bistable means;
   means coupling the $\overline{Q}$ output of said second bistable means to the second operating mode S1 input of said shift register means;
   an initial Master Clear Lo signal establishing said first bistable means in a Clear state for enabling said first bistable means to couple a Q output Hi signal to the first one of the N inputs of said shift register means and a subsequent Master Clear Hi signal establishing said first bistable means in a Set state for enabling said first bistable means to couple a Q output Lo signal to the Clear input of said second bistable means and establishing said second bistable means in a Clear state for coupling a Q output Lo signal to the second operating mode S1 input of said shift register means whereby said shift register means is enabled to serially end-around shift a Hi signal through the N stages of said serial shift means and serially enable said N pulse generator means to output said N phase clock signal.

* * * * *